United States Patent [19]

Ahn et al.

[11] Patent Number: 5,572,146
[45] Date of Patent: Nov. 5, 1996

[54] NOISE ATTENUATION OUTPUT BUFFER

[75] Inventors: Sang W. Ahn; Byoung J. Yoon, both of Kyoungkido, Rep. of Korea

[73] Assignee: Hyundai Electronics Industries Co., Ltd., Kyoungkido, Rep. of Korea

[21] Appl. No.: 518,017

[22] Filed: Aug. 22, 1995

[30] Foreign Application Priority Data

Aug. 24, 1994 [KR] Rep. of Korea ............... 1994-20940

[51] Int. Cl.$^6$ .................................................. H03K 17/16
[52] U.S. Cl. .................. 326/27; 326/26; 326/83
[58] Field of Search ....................... 326/21, 24, 26–28, 326/82–83, 86

[56] References Cited

U.S. PATENT DOCUMENTS

| | | | |
|---|---|---|---|
| 5,059,823 | 10/1991 | Ahsanullah | 326/27 |
| 5,233,238 | 8/1993 | Mattos | 326/27 |
| 5,319,260 | 6/1994 | Wanlass | 326/26 |
| 5,367,205 | 11/1994 | Powell | 326/82 X |
| 5,438,545 | 8/1995 | Sim | 326/83 X |
| 5,450,019 | 9/1995 | McClure et al. | 326/28 |
| 5,491,428 | 2/1996 | Gasparik | 326/27 |
| 5,497,113 | 3/1996 | Uber | 328/27 X |

*Primary Examiner*—David R. Hudspeth
*Attorney, Agent, or Firm*—Keck, Mahin & Cate

[57] ABSTRACT

A noise attenuation output buffer comprising a signal delay circuit for delaying input data for a predetermined time period, a NOR gate for NORing an output signal from the signal delay circuit and an enable signal, a pull-up/down driver for performing a pull-up operation in response to the input data and a pull-down operation in response to an output signal from the NOR gate to provide output data, a noise attenuation controller for outputting a noise attenuation signal in response to a drive voltage, the input data and the output signal from the NOR gate, and a noise attenuator for forming a current path between an output terminal of the NOR gate and a ground terminal in response to the noise attenuation signal from the noise attenuation controller and the output data from the pull-up/down driver to suppress the generation of noise. According to the present invention, the noise attenuation output buffer effectively controls ON timing of the noise attenuator to effectively attenuate noise in the output data and enhance the data output speed.

8 Claims, 6 Drawing Sheets

NOISE ATTENUATION OUTPUT BUFFER

BACKGROUND OF THE INVENTION

1. Field of the Invention

The present invention relates in general to output buffers for semiconductor devices, and more particularly to a noise attenuation output buffer for effectively attenuating noise in output data.

2. Description of the Prior Art

Generally, a noise attenuation output buffer is mainly used in a semiconductor device to attenuate noise in output data. In the noise attenuation output buffer, noise is generated when a pull-down N-channel Metal-Oxide-Silicon (referred to hereinafter as NMOS) transistor is changed from its OFF state to its ON state. In order to reduce such noise, a current path is formed between a gate terminal of the pull-down NMOS transistor and a ground terminal at a time point that a signal is applied to turn on the pull-down NMOS transistor. The formation of current path has the effect of absorbing noise being instantaneously generated. Such a conventional noise attenuation output buffer will hereinafter be described with reference to FIGS. 1 to 2B.

Referring to FIG. 1, there is shown a detailed circuit diagram of a conventional noise attenuation output buffer. As shown in this drawing, the conventional noise attenuation output buffer comprises a NOR gate 1 for NORing an enable signal and input data, and a pull-up/down driver 4 for performing a pull-up operation in response to the input data and a pull-down operation in response to an output signal from the NOR gate 1 to provide output data. The pull-up/down driver 4 includes a pull-up P-channel Metal-Oxide-Silicon (referred to hereinafter as PMOS) transistor and a pull-down NMOS transistor. The pull-up PMOS transistor has a gate terminal for inputting an inverted one of the input data. The pull-down NMOS transistor has a gate terminal for inputting the output signal from the NOR gate 1.

The conventional noise attenuation output buffer further comprises a noise attenuation controller 2 for outputting a noise attenuation signal through a noise attenuation signal output node in response to a drive voltage Vcc, the input data and the output signal from the NOR gate 1. When the input data is "0" or low in logic and noise is increased as the drive voltage Vcc exceeds a normal value of, for example, 5 V, the noise attenuation controller 2 transfers the drive voltage Vcc to the noise attenuation signal output node. As a result, the noise attenuation signal on the noise attenuation signal output node becomes high in logic. On the contrary, when the input data is "1" or high in logic, the noise attenuation controller 2 transfers the output signal from the NOR gate 1 to the noise attenuation signal output node. As a result, the noise attenuation signal on the noise attenuation signal output node becomes low in logic.

The conventional noise attenuation output buffer further comprises a noise attenuator 3 for performing a switching operation in response to the noise attenuation signal from the noise attenuation controller 2 and the output data from the pull-up/down driver 4 to form a current path between an output terminal of the NOR gate 1 and a ground terminal. When the noise attenuation signal from the noise attenuation controller 2 and the output data from the pull-up/down driver 4 are both high in logic, the current path is formed between the output terminal of the NOR gate 1 and the ground terminal, thereby absorbing noise generated when the pull-down NMOS transistor in the pull-up/down driver 4 is turned on.

The noise attenuation controller 2 includes an NMOS transistor, a first PMOS transistor and three second PMOS transistors. The NMOS transistor is connected between the output terminal of the NOR gate 1 and the noise attenuation signal output node and has a gate terminal for inputting the input data. The first PMOS transistor has a gate terminal for inputting the input data and a source terminal for inputting the drive voltage Vcc. The three second PMOS transistors are connected in series between a drain terminal of the first PMOS transistor and the noise attenuation signal output node. Each of the three second PMOS transistors has a gate terminal and a drain terminal connected to each other. The three second PMOS transistors are turned on with their sources applied with the drive voltage Vcc exceeding the normal value of 5 V. As a result, when the input data is changed from high to low in logic and noise is increased as the drive voltage Vcc exceeds the normal value of 5 V, the three second PMOS transistors transfer the drive voltage Vcc to the noise attenuation signal output node to generate the noise attenuation signal of high logic.

The noise attenuator 3 includes first and second NMOS transistors. The first NMOS transistor has a gate for inputting the noise attenuation signal from the noise attenuation controller 2 and a drain terminal connected to the output terminal of the NOR gate 1. The second NMOS transistor has a gate terminal for inputting the output data from the pull-up/down driver 4, a drain terminal connected to a source terminal of the first NMOS transistor and a source terminal connected to the ground terminal. When the noise attenuation signal from the noise attenuation controller 2 and the output data from the pull-up/down driver 4 are both high in logic, the first and second NMOS transistors are turned on to form the current path between the output terminal of the NOR gate 1 and the ground terminal. On the contrary, when the output data from the pull-up/down driver 4 is low in logic or the noise attenuation signal from the noise attenuation controller 2 is low in logic under the effect of little noise, the first or second NMOS transistor is turned off to remove the current path between the output terminal of the NOR gate 1 and the ground terminal.

FIG. 2A is a waveform diagram illustrating voltage-time characteristics of the components in FIG. 1 and FIG. 2B is a waveform diagram illustrating a current-time characteristic of the pull-down NMOS transistor in FIG. 1. In FIG. 2A, a solid line indicates a voltage waveform of the input data, a dotted and dashed line indicates a voltage waveform of the output signal from the noise attenuation controller 2, a phantom line indicates a voltage waveform of the output signal from the NOR gate 1 and a dotted line indicates a voltage waveform of the output data from the pull-up/down driver 4. As seen from these drawings, when the input data is changed from high to low in logic, the output signal from the NOR gate 1 begins to make a transition before the output signal from the noise attenuation controller 2 goes from low to high in logic to completely turn on the noise attenuator 3. For this reason, noise cannot be effectively attenuated. Namely, an increase rate dI/dt of current flowing through the pull-down NMOS transistor which is the main factor of generating noise becomes considerably large due to the earlier transition of the output signal from the NOR gate 1. In this case, the increase rate dI/dt of current flowing through the pull-down NMOS transistor is typically $12.5 \times 10^6$. Furthermore, the ineffective ON timing of the noise attenuator 3 results in extension in the voltage waveform of the output signal from the NOR gate 1 and the current waveform of the pull-down NMOS transistor, reducing the actual data output speed.

In result, the conventional noise attenuation output buffer has the disadvantage that it cannot effectively attenuate noise in the output data because of the ineffective ON timing of the noise attenuator. Also, the ineffective ON timing of the noise attenuator results in a degradation in the data output speed.

SUMMARY OF THE INVENTION

Therefore, the present invention has been made in view of the above problem, and it is an object of the present invention to provide a noise attenuation output buffer for effectively controlling ON timing of a noise attenuator to effectively attenuate noise in output data and enhance the data output speed.

In accordance with the present invention, the above and other objects can be accomplished by a provision of a noise attenuation output buffer comprising signal delay means for delaying input data for a predetermined time period; NORing means for NORing an Output signal from the signal delay means and an enable signal; pull-up/down drive means for performing a pull-up operation in response to the input data and a pull-down operation in response to an output signal from the NORing means to provide output data; noise attenuation control means for outputting a noise attenuation signal in response to a drive voltage, the input data and the output signal from the NORing means; and noise attenuation means for forming a current path between an output terminal of the NORing means and a ground terminal in response to the noise attenuation signal from the noise attenuation control means and the output data from the pull-up/down drive means to suppress the generation of noise.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

First, the principle of a noise attenuation output buffer in accordance with an embodiment of the present invention will briefly be mentioned. Input data to be applied to a gate terminal of a pull-down NMOS transistor is delayed for a predetermined time period until a current path is completely formed with respect to the gate terminal of the pull-down NMOS transistor, so that the current path can effectively absorb noise. A high-speed noise attenuation controller is used to enhance the forming speed of the noise attenuation current path. A high-speed noise attenuator is used to rapidly turn off the current path after absorbing noise. Therefore, the noise attenuation output buffer is enhanced in its operating speed.

Figure 1:
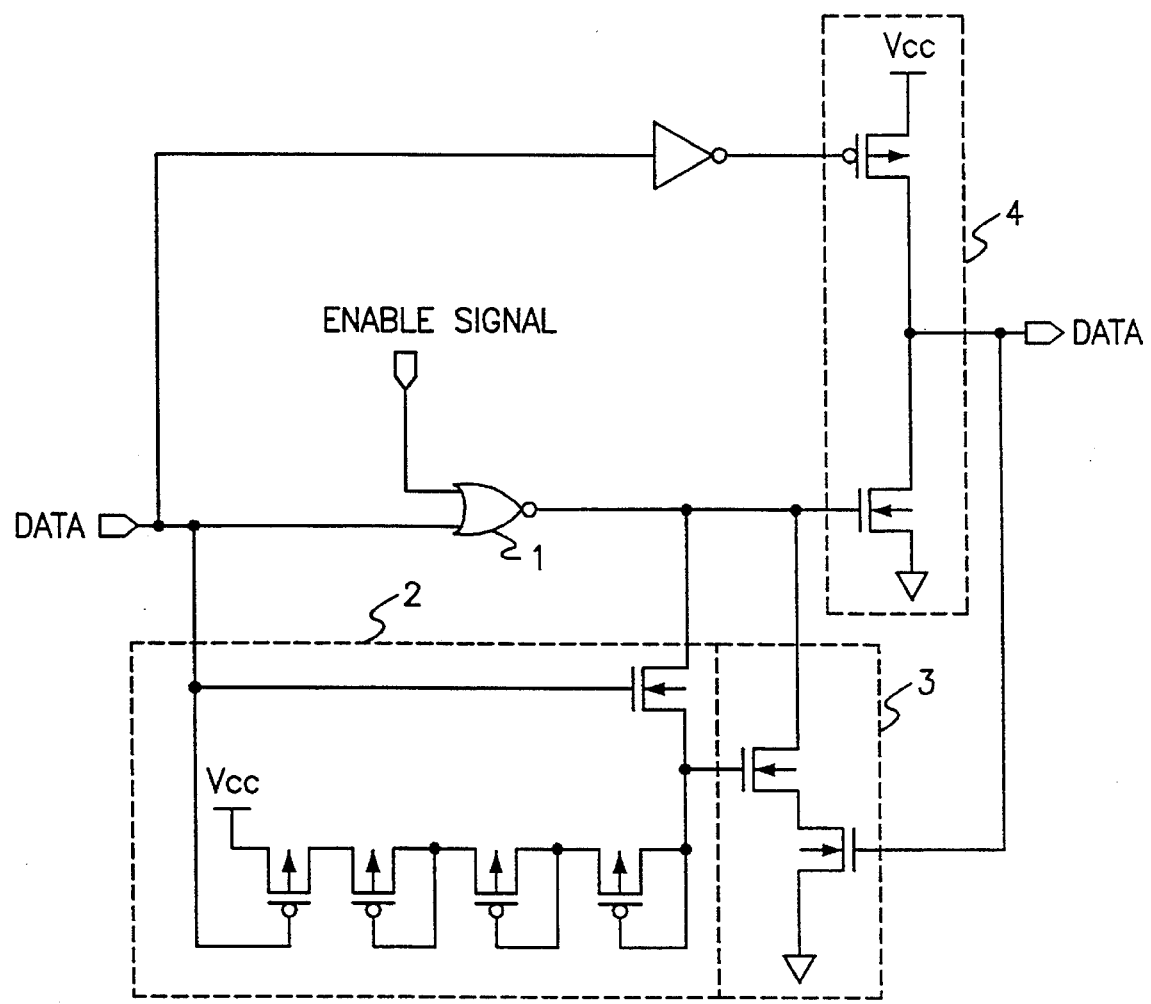
FIG. 1 is a detailed circuit diagram of a conventional noise attenuation output buffer.
Figure 2A:
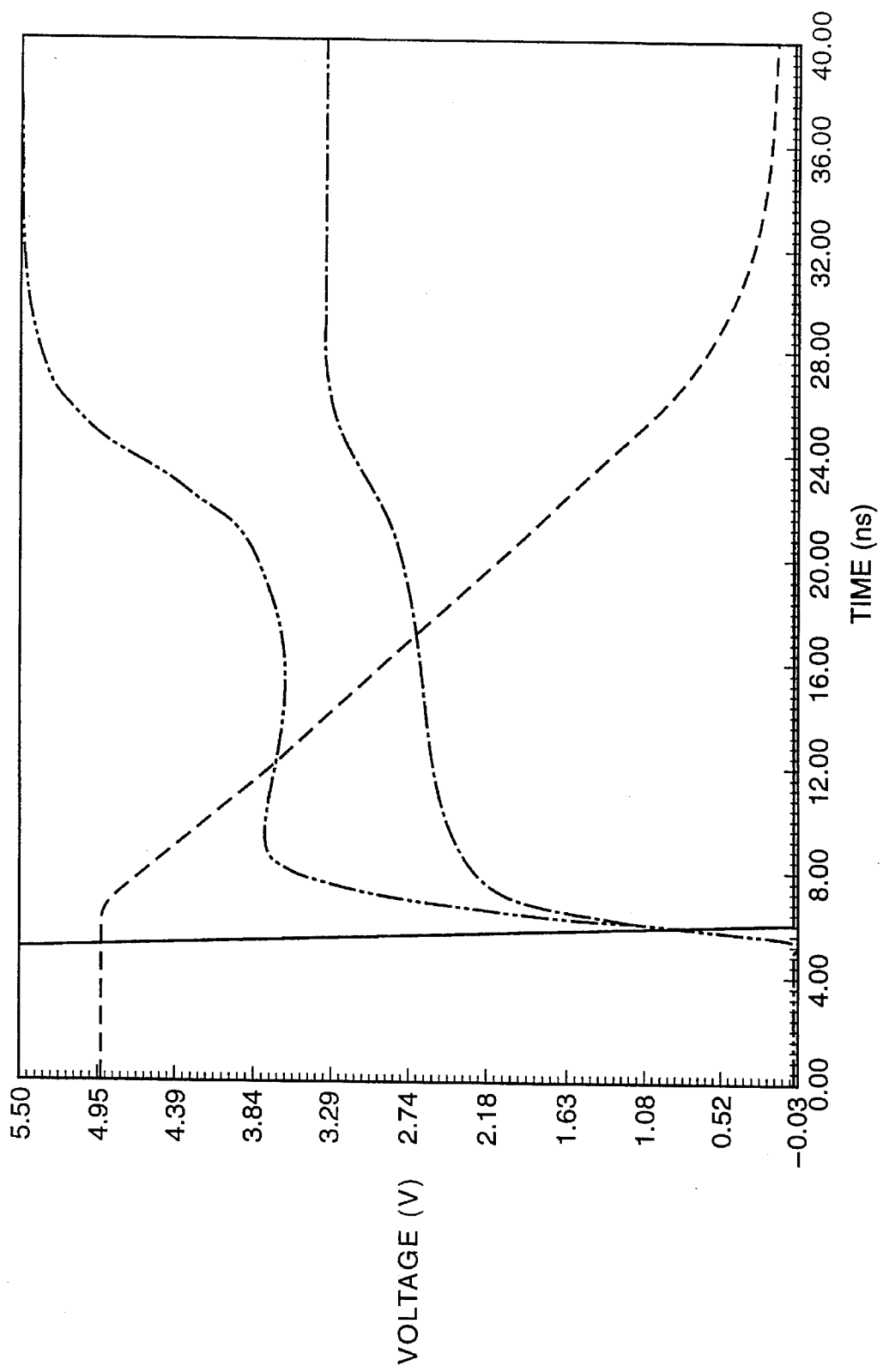
FIG. 2A is a waveform diagram illustrating voltage-time characteristics of components in FIG. 1.
Figure 2B:
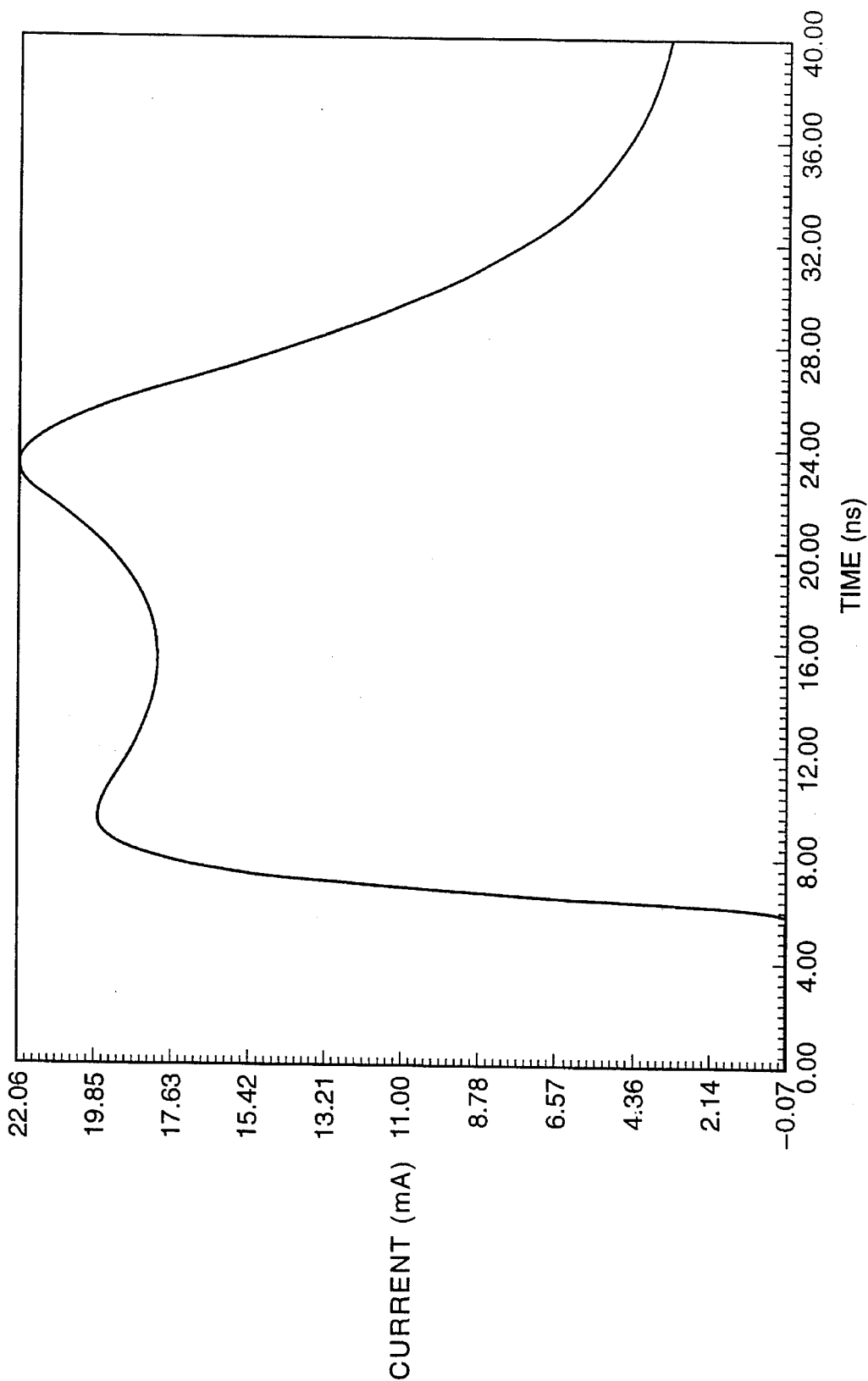
FIG. 2B is a waveform diagram illustrating a current-time characteristic of a pull-down NMOS transistor in FIG. 1.
Figure 3:
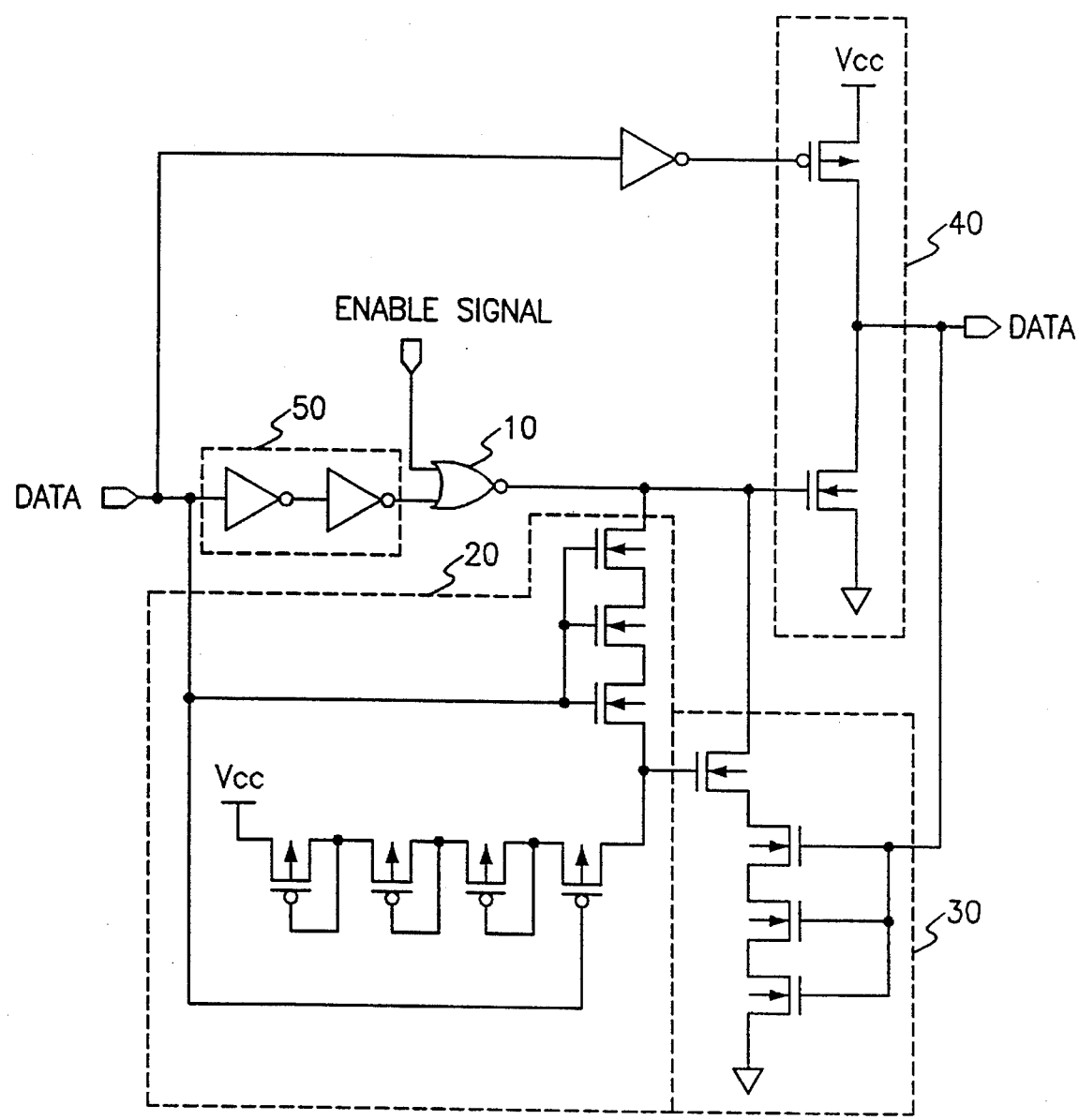
FIG. 3 is a detailed circuit diagram of a noise attenuation output buffer in accordance with an embodiment of the present invention.

Referring to FIG. 3, there is shown a detailed circuit diagram of the noise attenuation output buffer in accordance with the embodiment of the present invention. As shown in this drawing, the noise attenuation output buffer comprises a signal delay circuit 50 for delaying the input data for the predetermined time period, a NOR gate 10 for NORing an output signal from the signal delay circuit 50 and an enable signal, and a pull-up/down driver 40 for performing a pull-up operation in response to the input data and a pull-down operation in response to an output signal from the NOR gate 10 to provide output data. The pull-up/down driver 40 includes a pull-up PMOS transistor and a pull-down NMOS transistor. The pull-up PMOS transistor has a gate terminal for inputting an inverted one of the input data. The pull-down NMOS transistor has a gate terminal for inputting the output signal from the NOR gate 10.

The noise attenuation output buffer further comprises a noise attenuation controller 20 for outputting a noise attenuation signal through a noise attenuation signal output node in response to a drive voltage Vcc, the input data and the output signal from the NOR gate 10. When the input data is "0" or low in logic and noise is increased as the drive voltage Vcc exceeds a normal value of, for example, 5 V, the noise attenuation controller 20 transfers the drive voltage Vcc to the noise attenuation signal output node. As a result, the noise attenuation signal on the noise attenuation signal output node becomes high in logic. On the contrary, when the input data is "1" or high in logic, the noise attenuation controller 20 transfers the output signal from the NOR gate 10 to the noise attenuation signal output node. As a result, the noise attenuation signal on the noise attenuation signal output node becomes low in logic.

The noise attenuation output buffer further comprises a noise attenuator 30 for performing a switching operation in response to the noise attenuation signal from the noise attenuation controller 20 and the output data from the pull-up/down driver 40 to form a current path between an output terminal of the NOR gate 10 and a ground terminal. When the noise attenuation signal from the noise attenuation controller 20 and the output data from the pull-up/down driver 40 are both high in logic, the current path is formed between the output terminal of the NOR gate 10 and the ground terminal, thereby absorbing noise generated when the pull-down NMOS transistor in the pull-up/down driver 40 is turned on.

The signal delay circuit 50 includes two inverters connected in series. The two inverters act to delay the input data to completely turn on the noise attenuator 30 before the NOR gate 10 makes a transition.

The noise attenuation controller 20 includes a first PMOS transistor, three second PMOS transistors and three NMOS transistors. The first PMOS transistor has a gate terminal for inputting the input data and a drain terminal connected to the noise attenuation signal output node. The three NMOS transistors are connected in series between the output terminal of the NOR gate 10 and the noise attenuation signal output node. The three NMOS transistors have gate terminals for inputting the input data in common. The three second PMOS transistors are connected in series between a drive voltage source and a source terminal of the first PMOS transistor. Each of the three second PMOS transistors has a gate terminal and a drain terminal connected to each other. The three second PMOS transistors are turned on with their sources applied with the drive voltage Vcc exceeding the normal value of 5 V. When the input data is changed from high to low in logic under the condition that the three second PMOS transistors are turned on, the first PMOS transistor transfers the drive voltage Vcc rapidly to the noise attenuation signal output node to generate the noise attenuation signal of high logic. At this time, the three NMOS transistors are rapidly turned off with their threshold voltages increasing due to a back bias effect, resulting in the drain terminal of the first PMOS transistor being rapidly charged up. As a result, the noise attenuation signal of high logic is outputted at high speed.

The noise attenuator 30 includes a first NMOS transistor and three second NMOS transistors. The first NMOS transistor has a gate terminal for inputting the noise attenuation signal from the noise attenuation controller 20 and a drain terminal connected to the output terminal of the NOR gate 10. The three second NMOS transistors are connected in series between a source terminal of the first NMOS transistor and the ground terminal. The three second NMOS transistors have gates for inputting the output data from the pull-up/down driver 40 in common. When the noise attenuation signal from the noise attenuation controller 20 and the output data from the pull-up/down driver 40 are both high in logic, the first NMOS transistor and the three second NMOS transistors are turned on to form the current path between the output terminal of the NOR gate 10 and the ground terminal. On the contrary, when the output data from the pull-up/down driver 40 is low in logic or the noise attenuation signal from the noise attenuation controller 20 is low in logic under the effect of little noise, the first NMOS transistor or the three second NMOS transistors are turned off to remove the current path between the output terminal of the NOR gate 10 and the ground terminal. When the output data from the pull-up/down driver 40 is low in logic, the three second NMOS transistors are rapidly turned off with their threshold voltages increasing due to the back bias effect. Therefore, the noise attenuation output buffer is enhanced in its operating speed.

Figure 4A:
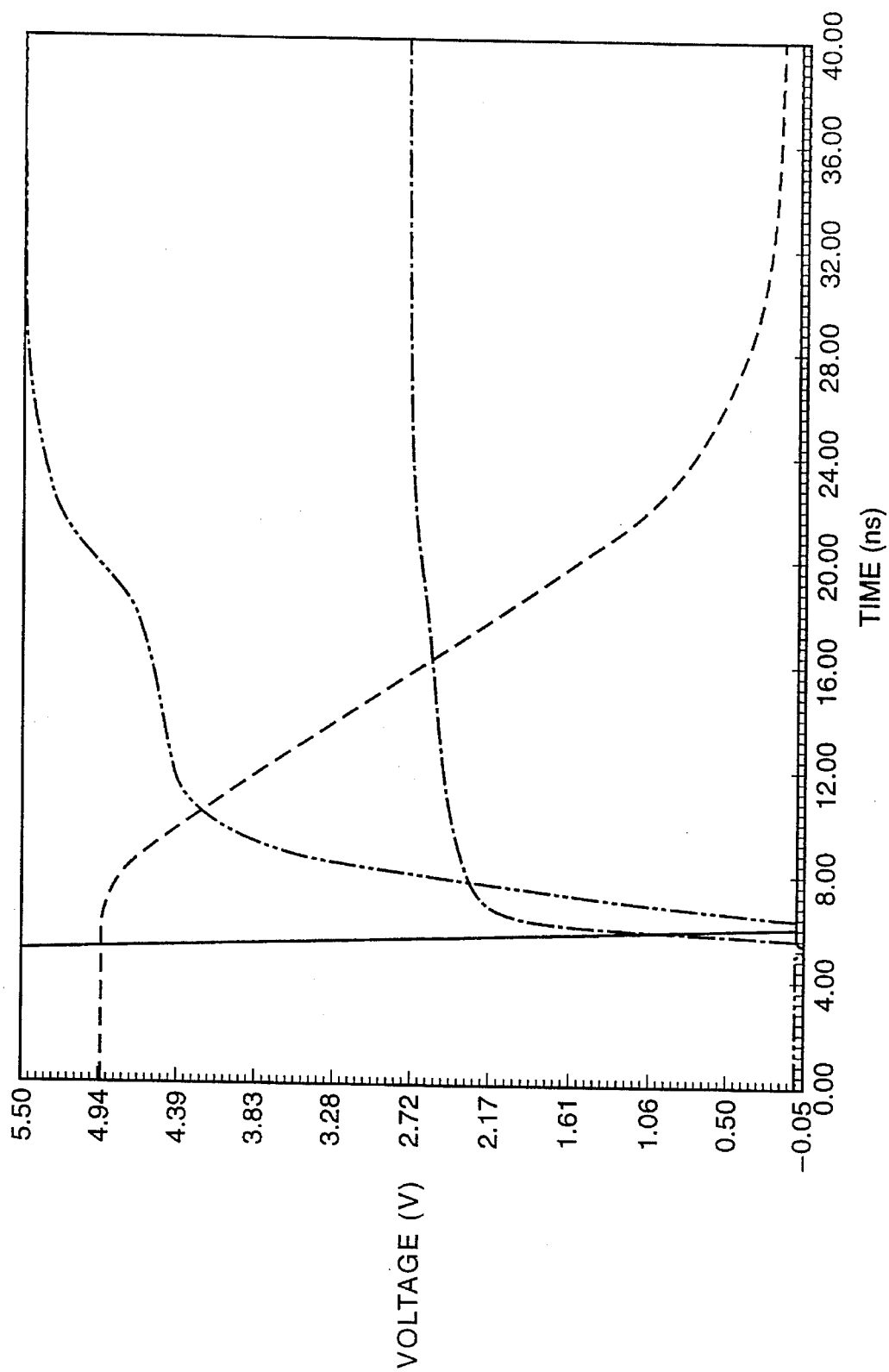
FIG. 4A is a waveform diagram illustrating voltage-time characteristics of components in FIG. 3.
Figure 4B:
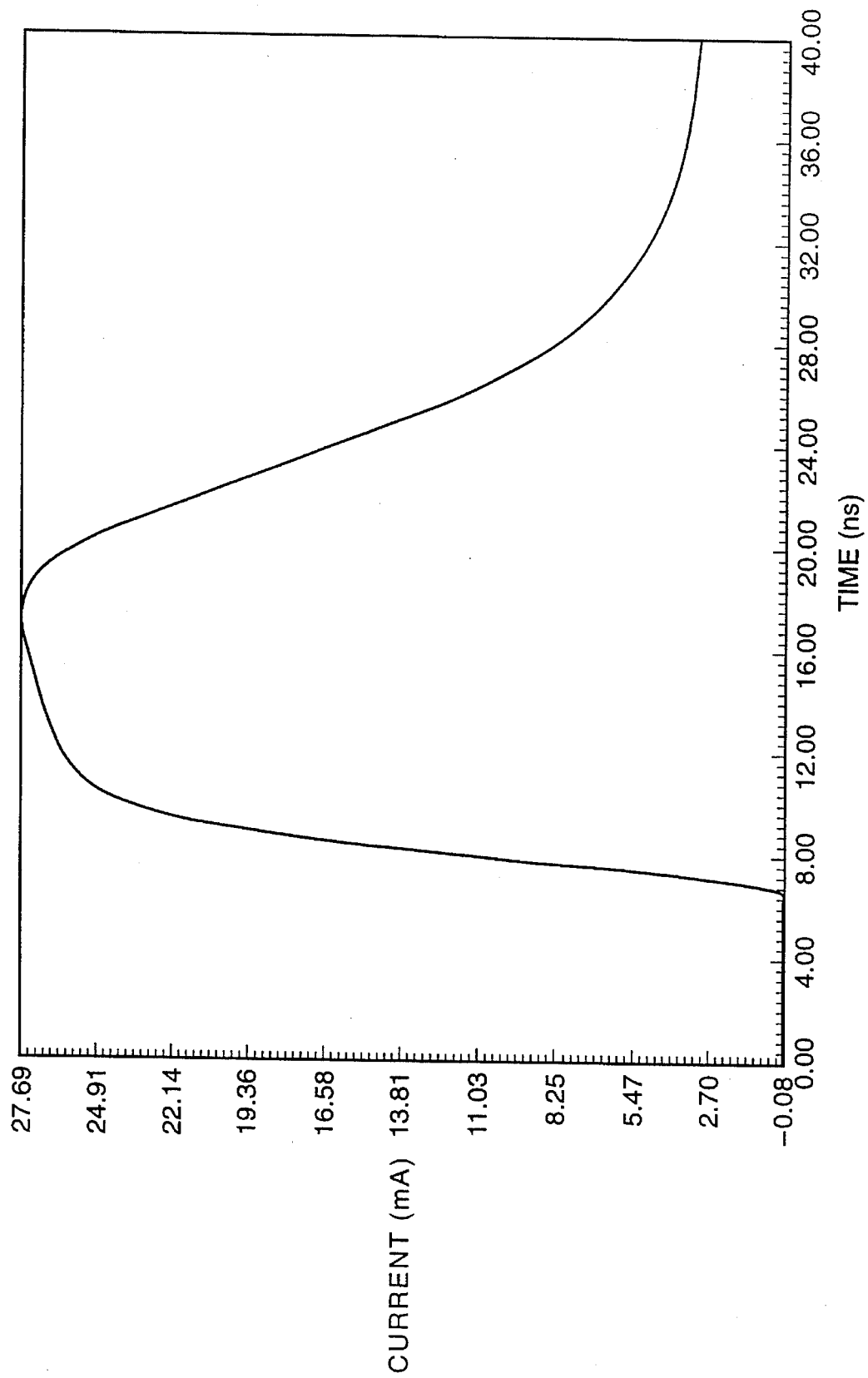
FIG. 4B is a waveform diagram illustrating a current-time characteristic of a pull-down NMOS transistor in FIG. 3.

FIG. 4A is a waveform diagram illustrating voltage-time characteristics of the components in FIG. 3 and FIG. 4B is a waveform diagram illustrating a current-time characteristic of the pull-down NMOS transistor in FIG. 3. In FIG. 4A, a solid line indicates a voltage waveform of the input data, a dotted and dashed line indicates a voltage waveform of the output signal from the noise attenuation controller 20, a phantom line indicates a voltage waveform of the output signal from the NOR gate 10 and a dotted line indicates a voltage waveform of the output data from the pull-up/down driver 40. As seen from these drawings, the output signal from the noise attenuation controller 20 makes a transition earlier than the output signal from the NOR gate 10, so that noise can be effectively attenuated. Namely, an increase rate dI/dt of current being applied to the gate terminal of the pull-down NMOS transistor which is the main factor of generating noise is $11.3 \times 10^6$, reduced by about 9.6% as compared with the conventional one. Furthermore, the turn-off speed of the noise attenuator 30 is increased, resulting in the operating speed of the noise attenuation output buffer being enhanced by 25% as compared with the conventional one.

As apparent from the above description, according to the present invention, the noise attenuation output buffer effectively controls the ON timing of the noise attenuator. Therefore, noise in the output data is effectively attenuated and the data output speed is enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A noise attenuation output buffer comprising:

signal delay means for delaying input data for a predetermined time period;

NORing means for NORing an output signal from said signal delay means and an enable signal;

pull-up/down drive means for performing a pull-up operation in responses to the input data and a pull-down operation in response to an output signal from said NORing means to provide output data;

noise attenuation control means for outputting a noise attenuation signal in response to a drive voltage, the input data and the output signal from said NORing means; and noise attenuation means for forming a current path between an output terminal of said NORing means and a ground terminal in response to the noise attenuation signal from said noise attenuation control means and the output data from said pull-up/down drive means to suppress the generation of noise.

2. A noise attenuation output buffer as set forth in claim 1, wherein said signal delay means includes a plurality of inverters connected in series.

3. A noise attenuation output buffer as set forth in claim 1, wherein said noise attenuation control means includes:

a first PMOS transistor having a gate terminal for inputting the input data and a drain terminal connected to a noise attenuation signal output node;

a plurality of second PMOS transistors connected in series between a drive voltage source and a source terminal of said first PMOS transistor, each of said plurality of second PMOS transistors having a gate terminal and a drain terminal connected to each other; and a plurality of first NMOS transistors connected in series between the output terminal of said NORing means and said noise attenuation signal output node, said plurality of first NMOS transistors having gate terminals for inputting the input data in common.

4. A noise attenuation output buffer as set forth in claim 3, wherein said noise attenuation means includes:

a second NMOS transistor having a gate terminal for inputting the noise attenuation signal from said noise attenuation control means and a drain terminal connected to the output terminal of said NORing means; and a plurality of third NMOS transistors connected in series between a source terminal of said second NMOS transistor and said ground terminal, said plurality of third NMOS transistors having gates for inputting the output data from said pull-up/down drive means in common.

5. A noise attenuation output buffer as set forth in claim 4, wherein said pull-up/down drive means includes:

a pull-up transistor having a gate terminal for inputting an inverted one of the input data; and a pull-down transistor having a gate terminal for inputting the output signal from said NORing means.

6. A noise attenuation output buffer as set forth in claim 2, wherein said noise attenuation control means includes:

a first PMOS transistor having a gate terminal for inputting the input data and a drain terminal connected to a noise attenuation signal output node;

a plurality of second PMOS transistors connected in series between a drive voltage source and a source terminal of said first PMOS transistor, each of said plurality of second PMOS transistors having a gate terminal and a drain terminal connected to each other; and a plurality of first NMOS transistors connected in series between the output terminal of said NORing means and said noise attenuation signal output node, said plurality of first NMOS transistors having gate terminals for inputting the input data in common.

7. A noise attenuation output buffer as set forth in claim 6, wherein said noise attenuation means includes:

a second NMOS transistor having a gate terminal for inputting the noise attenuation signal from said noise attenuation control means and a drain terminal connected to the output terminal of said NORing means; and a plurality of third NMOS transistors connected in series between a source terminal of said second NMOS transistor and said ground terminal, said plurality of third NMOS transistors having gates for inputting the output data from said pull-up/down drive means in common.

8. A noise attenuation output buffer as set forth in claim 7, wherein said pull-up/down drive means includes:

a pull-up transistor having a gate terminal for inputting an inverted one of the input data; and a pull-down transistor having a gate terminal for inputting the output signal from said NORing means.

* * * * *